United States Patent
He et al.

(10) Patent No.: US 11,596,084 B2
(45) Date of Patent: Feb. 28, 2023

(54) THERMAL MODULE WITH HEAT PIPE HAVING A SHARP ANGLED BEND FOR INCREASED COOLING

(71) Applicant: Dell Products L.P., Round Rock, TX (US)

(72) Inventors: Qinghong He, Austin, TX (US); Travis North, Cedar Park, TX (US)

(73) Assignee: Dell Products L.P., Round Rock, TX (US)

(*) Notice: Subject to any disclaimer, the term of this patent is extended or adjusted under 35 U.S.C. 154(b) by 49 days.

(21) Appl. No.: 17/241,932

(22) Filed: Apr. 27, 2021

(65) Prior Publication Data

US 2022/0346275 A1 Oct. 27, 2022

(51) Int. Cl.
H05K 7/20 (2006.01)

(52) U.S. Cl.
CPC ..... *H05K 7/20336* (2013.01); *H05K 7/20172* (2013.01); *H05K 7/20409* (2013.01)

(58) Field of Classification Search
CPC ........... H05K 7/20336; H05K 7/20172; H05K 7/20409
See application file for complete search history.

(56) References Cited

U.S. PATENT DOCUMENTS

| 10,225,955 B1* | 3/2019 | Hill | H05K 7/20945 |
| 10,598,442 B2* | 3/2020 | Liu | F28D 15/0233 |
| 2008/0156460 A1* | 7/2008 | Hwang | H01L 23/427 |
| | | | 165/104.33 |

* cited by examiner

Primary Examiner — Mukundbhai G Patel
(74) Attorney, Agent, or Firm — McDermott Will & Emery LLP

(57) ABSTRACT

A thermal module with a heat pipe configured with a first portion configured for contact with an edge of a plurality of fins in a fin stack, a second portion configured for contact with a side of one fin in the fin stack and a sharp angled bend is formed between the first portion and the second portion to fluidly isolate the first portion from the second portion. The first portion comprises a usable length of the heat pipe that efficiently transfers heat based on phase transitioning by the fluid. The second portion is formed from at least some of the unusable length of the heat pipe. By configuring the heat pipe such that more fins contact the usable length of the heat pipe, heat transfer from the heat pipe to the fin stack is increased.

20 Claims, 2 Drawing Sheets

THERMAL MODULE WITH HEAT PIPE HAVING A SHARP ANGLED BEND FOR INCREASED COOLING

BACKGROUND

Field of the Disclosure

This disclosure relates generally to information handling systems and, more particularly, to thermal modules with heat pipes configured for increased cooling.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A heat pipe comprises a sealed hollow tube formed from a material selected for high heat conduction and contains a two-phase fluid and a wicking material. A first end of the heat pipe is positioned near a set of components, wherein heat is transferred from the set of components through the heat conducting material to the two-phase fluid. Heat applied to the two-phase fluid causes the fluid to transition from a liquid to a vapor, wherein the vapor travels axially (along the hollow tube) toward a second end positioned near a heat sink. When the vapor condenses, the wicking material transports the two-phase fluid back to the first end, where the cycle repeats. The material used to form the hollow tube, the cross-section area of the hollow tube, the two-phase fluid, the wicking material, and the heat sink are selected to maximize the heat transfer capabilities of the heat pipe.

SUMMARY

The end of a heat pipe has a much lower heat transfer capability compared to the main body of the heat pipe due to poor wick configurations. Therefore, fins attached to the end of the heat pipe are less effective and possibly ineffective in dissipating heat to an airflow generated by a cooling fan. In many laptops, extending the heat pipe beyond the fin stack is not an option, making part of the fin stack inevitably less efficient in a thermal module design.

Embodiments disclosed herein may be directed to a thermal module for use in a chassis for an information handling system. The thermal module comprises a fan for generating an airflow in the direction of a vent; a fin stack comprising a plurality of fins distributed over a width of the fin stack, the fin stack positioned relative to the vent; and a heat pipe comprising a first end configured for receiving heat from a set of components and a second end configured with a first portion for contact with an edge of a plurality of fins in the fin stack, a second portion for contact with a side of one fin of the plurality of fins, and a sharp angled bend formed in the heat pipe to fluidly isolate the first portion from the second portion.

A sharp angled bend in the hollow tube will close the heat pipe at the bend location and should be absolutely avoided in a typical case. But in this case, a sharp angled bend is acceptable because the second portion of the heat pipe is not used to transfer heat and the sharp angled bend allows the second portion of the heat pipe to be coupled to a fin or a side of a fin stack.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes and contained in a chassis. For example, an information handling system may be a laptop computer, a consumer electronic device, a network storage device, or another suitable device contained in a chassis and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

As information handling systems 100 are installed in smaller portable chassis 110, the area in which a cooling system can occupy is also reduced. Cooling systems for portable chassis 110 often use cold plates, heat pipes, fin stacks and impeller-type fans to remove heat from chassis 110. Particular embodiments of a thermal module for increased heat transfer may be best understood by reference to FIGS. 1-3, wherein like numbers are used to indicate like and corresponding parts.

Figure 1:
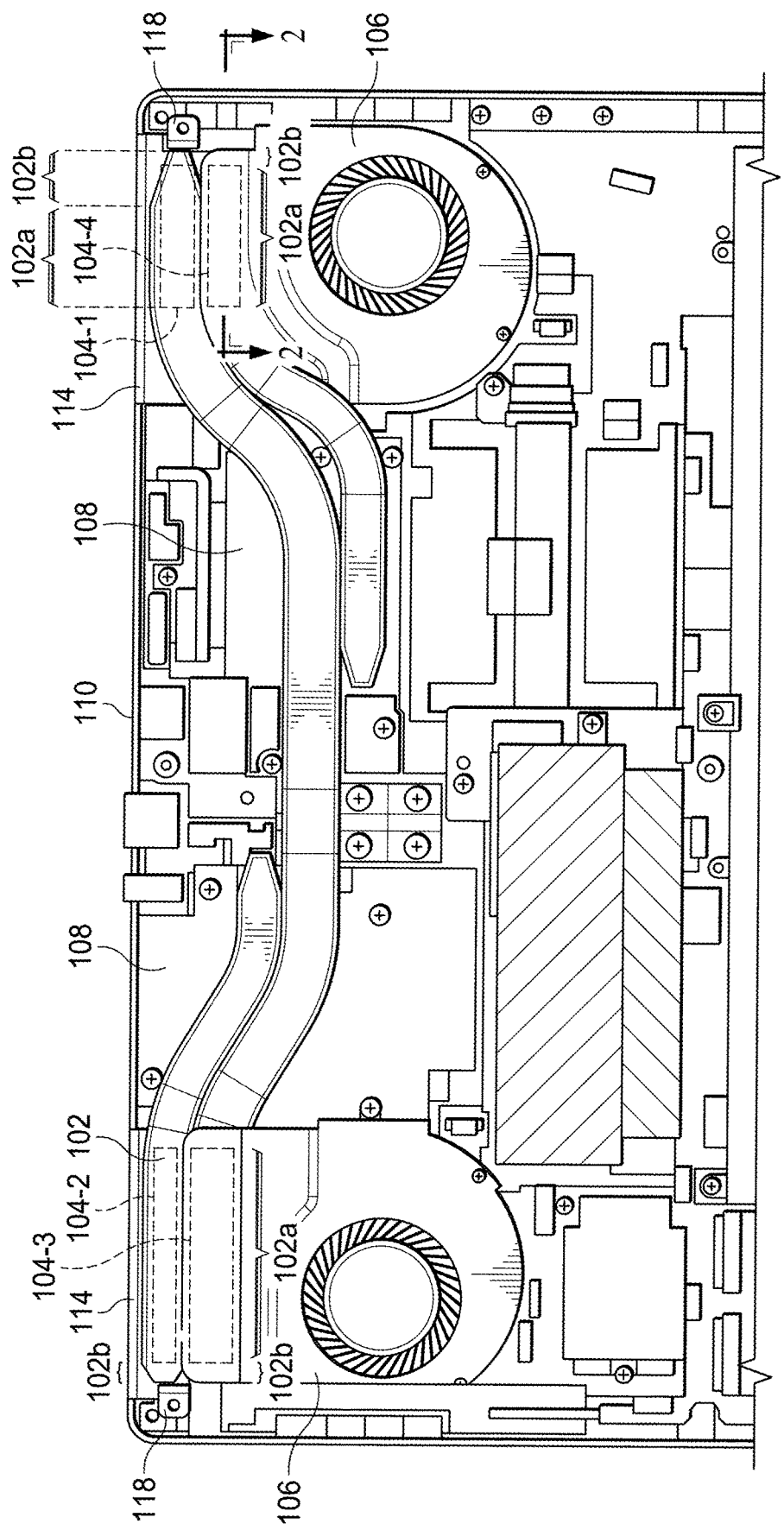
FIG. 1 is a top view of an information handling system in a portable chassis with an embodiment of a cooling system comprising fans, heat pipes and fin stacks for removing heat.

Turning now to the drawings, FIG. 1 illustrates a top cutaway view of an information handling system 100 in a chassis 110 with a cooling system comprising one or more cold plates 108 for conducting heat from components of information, at least one heat pipe 102 for transporting heat away from the one or more cold plates 108 to one or more fin stacks 104, and one or more fans 106 for generating airflow(s) through the one or more fin stacks 104 in the direction of vents 114.

Components of information handling system 100 may include, but are not limited to, components of a processor subsystem, which may comprise one or more processors, and components of a system bus that communicatively couples various system components to the processor subsystem including, for example, a memory subsystem, an I/O subsystem, local storage resource and a network interface.

Components of a processor subsystem may comprise a system, device, or apparatus operable to interpret and execute program instructions and process data, and may include a microprocessor, microcontroller, digital signal processor (DSP), application specific integrated circuit (ASIC), or other digital or analog circuitry configured to interpret and execute program instructions and process data. In some embodiments, components of a processor subsystem may interpret and execute program instructions and process data stored locally (e.g., in components of a memory subsystem). In the same or alternative embodiments, components of a processor subsystem may interpret and execute program instructions and process data stored remotely (e.g., in a network storage resource).

Components of a system bus may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Components of a memory subsystem may comprise a system, device, or apparatus operable to retain and retrieve program instructions and data for a period of time (e.g., computer-readable media). Components of a memory subsystem may comprise random access memory (RAM), electrically erasable programmable read-only memory (EEPROM), a PCMCIA card, flash memory, magnetic storage, opto-magnetic storage or a suitable selection or array of volatile or non-volatile memory that retains data after power is removed.

Components of an I/O subsystem may comprise a system, device, or apparatus generally operable to receive and transmit data to, from or within information handling system 100. Components of an I/O subsystem may represent, for example, a variety of communication interfaces, graphics interfaces for communicating with a display, video interfaces, user input interfaces, and peripheral interfaces. I/O subsystem 18 may include more, fewer, or different input/output devices or components.

Components of a local storage resource may comprise computer-readable media (e.g., hard disk drive, floppy disk drive, CD-ROM, and other types of rotating storage media, flash memory, EEPROM, or another type of solid-state storage media) and may be generally operable to store instructions and data. For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory, such as a solid-state drive (SSD) comprising solid-state flash memory; as well as communications media such as wires, optical fibers, microwaves, radio waves, and other electromagnetic or optical carriers; or any combination of the foregoing.

Components of a network interface may be a suitable system, apparatus, or device operable to serve as an interface between information handling system 100 and a network (not shown). Components of a network interface may enable information handling system 100 to communicate over a network using a suitable transmission protocol or standard. In some embodiments, components of a network interface may be communicatively coupled via a network to a network storage resource (not shown). A network coupled to a network interface may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to a network interface may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, Advanced Technology Attachment (ATA), Serial ATA (SATA), Advanced Technology Attachment Packet Interface (ATAPI), Serial Storage Architecture (SSA), Integrated Drive Electronics (IDE), or any combination thereof. A network coupled to a network interface or various components associated therewith may be implemented using hardware, software, or any combination thereof.

During operation of information handling system 100, components generate heat in performing the processes or purposes as mentioned above and require cooling. One approach to cooling information handling systems 100 comprises heat pipe 102 having a first end coupled to a component or cold plate 108 plate for receiving heat and a second end coupled to fin stack 104 positioned near a fan 106, wherein airflow generated by fan 106 passes over fins in fin stack 104 and out an exit vent 114 to remove heat from chassis 110.

Heat Pipes—General

Heat pipes 102 transfer heat away from components of information handling system 100 contained in chassis 110. A heat pipe 102 is generally manufactured as a sealed hollow tube containing a two-phase fluid and a wicking material. In information handling system 100, a first end may be positioned in contact with heat plate 108 from which heat is to be removed and a second end is positioned near a fin stack 104 to which the heat is transferred.

The process by which heat is removed from the information handling system 100 involves heat transfer from cold plate 108 causing the two-phase fluid to boil and the vapor moving through the hollow tube of heat pipe 102 to fin stack 104, wherein the two-phase fluid condenses at fin stack 104 and is transported through the hollow tube back to the first end via the wicking material.

Heat Pipe Design Results in Poor Heat Transfer Capabilities at the Ends

Due to the manufacturing processes commonly used for heat pipes 102, at least one end of heat pipe 102 is generally considered to be unusable because heat transfer using the fluid and wicking material is unavailable. It is common for approximately the last 8-12 mm of heat pipe 102 to be considered unusable length.

In information handling systems 100 with limited space within chassis 110, the design of heat pipes 102 with an end of the heat pipe 102 being unusable reduces the amount of heat that can be transferred to fin stack 104. For example, heat pipe 102 positioned with 10 mm of unusable length in contact with fin stack 104-1 may result in a 10-25% reduction in the number of fins 116 conducting heat away from heat pipe 102. Alternatively, extending the heat pipe 102 such that an unusable length is not in contact with any fins 116 (such as heat pipe 102 near fin stack 104-2) may not be possible due to components and structures 118 of chassis 110, especially in smaller chassis 110 such as laptops.

Heat Pipe Bending

When bending heat pipes 102, manufacturers typically take great care to ensure any bends in the hollow tube do not interfere with the heat transfer process described above. Ideally, any bends in the hollow tube are smooth radiused bends that allow convective cooling as described above. A smooth radiused bend may refer to a bend in which the inside radius comprises a continuous surface. A heat pipe 102 with a hollow tube may be configured with a minimum center line radius of curvature and a wall thickness to prevent wrinkling, flattening, pinching, collapsing or other deformation of the hollow tube. Overbending heat pipe 102 can cause cracking and splitting of the outer radius bend of the hollow tube and cause the inside radius to buckle, leading to wrinkles and a decrease in the inner cross-section area of the hollow tube.

Sharp Angled Bends in a Heat Pipe are Typically Avoided

A sharp angled bend that flattens or otherwise reduces the inner cross sectional area of the hollow tube can restrict or even prevent the flow of the fluid in either direction, reducing the effectiveness of heat pipe 102 in transferring heat. As used herein, a sharp angled bend may refer to a bend formed in the hollow tube of heat pipe 102 such that the inside bend comprises a discontinuous surface and the inner cross-section area of the hollow tube is zero or substantially zero, effectively closing heat pipe 102 at the sharp angled bend.

The angle at which a hollow tube transitions from having a smooth radiused bend to a sharp angled bend depends on the hollow tube material (e.g., copper) and the wall thickness of the hollow tube, as well as the manufacturing process used to form the heat pipe 102. Generally, the maximum angle for a sharp angled bend is the maximum angle that the hollow tube can be bent before cracks appear in the hollow tube or the fluid leaks out.

In some manufacturing processes, heat pipe 102 may transition from a smooth radiused bend to an angled bend when a large load is applied and heat pipe 102 is bent to approximately 45 degrees. Further bending of heat pipe 102 once angled bend causes buckling or wrinkling, which may impinge the wicking material and reduce convective heat transfer.

Continued bending of heat pipe 102 once an angled bend has started results in a sharp angled bend in the hollow tube, wherein the sharp angled bend closes the hollow tube such that fluid flow (either as a vapor or a liquid) is prevented. When two portions of the hollow tube are on either side of a sharp angled bend, the portions are fluidly isolated from each other such that fluid flow is minimized or even prevented such that heat transfer via conduction through the hollow tube material may be possible, but convective heat transfer using a two-phase fluid flowing through heat pipe 102 is unavailable. For heat pipes 102 used in information handling systems 100, a sharp angled bend may be between 70 and 120 degrees, wherein at 70 degrees, the sharp angled bend closes off heat pipe 102 and at 135 degrees, defects may form in the hollow tube that allow fluid to leak.

Thermal Module with a Heat Pipe with a Sharp Angled Bend Improves Heat Transfer

To overcome these inefficiencies and improve the cooling capabilities of a thermal module in an information handling system 100, embodiments may include a heat pipe configured for increased heat transfer to a fin stack. A heat pipe may have a first end configured for coupling to cold plate or a component. The heat pipe may have a second end with a first portion for contacting an edge of a plurality of fins in a fin stack and a second portion formed from an unusable length of the heat pipe, wherein the second portion is coupled to a side of one fin in the fin stack and is isolated from the first portion by a sharp angled bend configured to close heat pipe 102. A sharp angled bend in the hollow tube may close off an unusable portion of the heat pipe 102 such that no flow of the fluid is possible.

Figure 2:
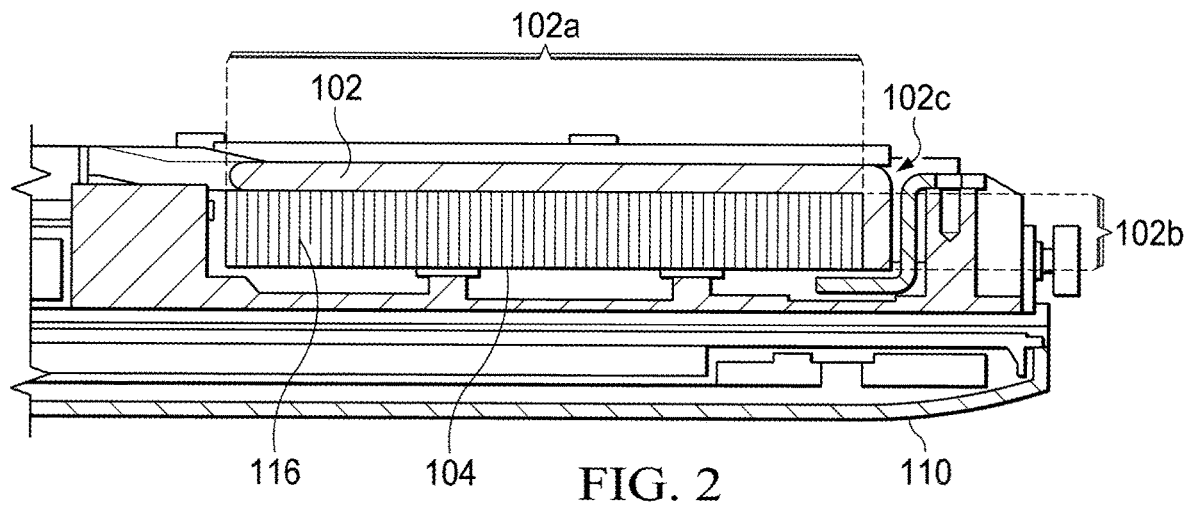
FIG. 2 depicts a cutaway partial side view of a portable chassis with one embodiment of a heat pipe formed with a sharp angled bend.
Figure 3:
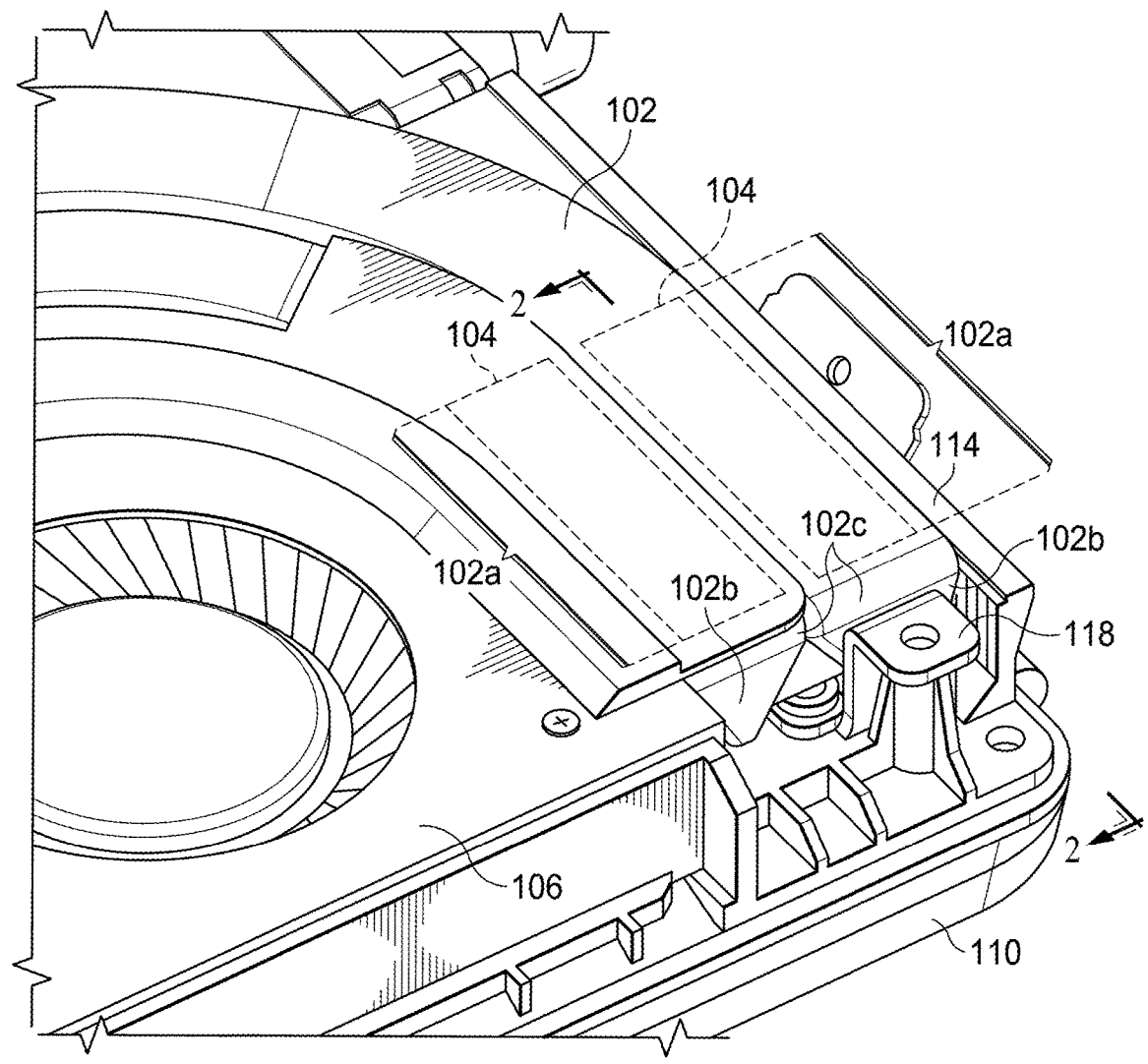
FIG. 3 depicts a partial perspective view of a portable chassis with one embodiment of a heat pipe formed with a sharp angled bend.

Referring to FIGS. 1-3, embodiments of a thermal module for information handling systems 100 may be configured with one or more heat pipes 102 for removing heat from a set of components in chassis 110 and transferring heat to one or more fin stacks 104, wherein airflow(s) generated by one or more fans 106 transfer the heat outside vents 114 to the ambient environment. FIG. 1 depicts four fin stacks 104 of different widths, which may be based on the amount of heat that a particular fin stack 104 needs to transfer out of chassis 110 as well as the position of a fin stack 104 relative to other components 20 in chassis and any mounts or other structures 118 of chassis 110.

Heat pipe 102 may be coupled at a first end to heat transfer plate 108 for efficient heat transfer from a component to heat pipe 102. Referring to one or more of FIGS. 1 and 2, second end of heat pipe 102 may be configured with a first portion 102a in contact with an edge of a plurality of fins 116 in fin stack 104 and a second portion 102b in contact with a side of one fin 116, with sharp angled bend 102c separating first portion 102a from second portion 102b. Second portion 102b may be welded, soldered, affixed using a thermally-conductive adhesive, or otherwise coupled to one fin 116 of fin stack 104.

Sharp angled bend 102c may be formed by bending second portion 102b to form a sharp angled bend relative to first portion 102a such that second portion 102b does not receive heat from first portion 102a based on fluid flow. The angle to which second portion 102b is bent may depend on the material, structure or dimensions of heat pipe 102 including the ductility of the hollow tube and the thickness or material of the wicking material. In some embodiments, heat pipe 102 may be crimped or flattened such that the inner cross-section area of a hollow tube is substantially zero before bending the second portion 102b.

In some embodiments, the location at which sharp angled 102c is formed in heat pipe 102 may be based on the design or manufacture of heat pipe 102. For example, one or more of the materials and processes used to manufacture heat pipe 102 may result in unusable length at the end of heat pipe 102, wherein an unusable length may refer to a portion of heat pipe 102 in which heat transfer does not occur or occurs at a low transfer rate. An unusable length may be 8-12 mm from an end of heat pipe 102. In some embodiments, sharp angled bend 102c may be formed approximately 8-12 mm from the end of heat pipe 102. In some embodiments, the angle to which second portion 102b is bent may be any angle from a minimum angle necessary to fluidly isolate second portion 102b from first portion 102a and a maximum angle at which heat pipe 102 is able to contain a fluid without leaking. In some embodiments, sharp angled bend 102c may be between 70-120 degrees. In some embodiments, sharp angled bend 102c may be approximately 90 degrees.

In some embodiments, the location at which sharp angled bend 102c is formed in heat pipe 102 may be based on the design of fin stack 104. For example, fin stack 104 may be manufactured with a height of 8 mm. In this situation, sharp angled bend 102c may be formed approximately 8 mm from the end of heat pipe 102 such that, when sharp angled bend 102c is formed in heat pipe 102, second portion 102b does not extend higher than fin stack 104. Referring to FIG. 1, heat pipe 102 positioned with a second end near fin stack 104-1 does not have a sharp angled bend such that not all fins 116 in fin stack 104-1 are in contact with a usable length of heat pipe 102. Heat pipe 102 near fin stack 104-2 does not have a sharp angled bend such that the second end extends beyond fin stack 104-2 but contacts structure 118. Both of these situations are undesirable.

Still referring to one or more of FIGS. 1-3, fin stack 104 may be manufactured with a width that is constrained due to components or structural features 118 in chassis 110. As depicted in FIG. 2, heat pipe 102 may be manufactured with a first portion 102a extending along substantially the width of fin stack 104 such that an edge of each fin 116 of a plurality of fins 116 in fin stack 104 is in contact with first portion 102a.

As depicted in one or more of FIGS. 1-3, heat pipe 102 may be configured for coupling with fin stack 104-3 or 104-4, wherein heat pipe 102 comprises a sharp angled bend 102c formed such that second portion 102b extends along substantially the height of fin stack 104 and is in contact with one fin 116 in fin stack 104 but heat pipe 102 does not contact structures 118 in chassis 110. These configurations allow a thermal module to provide increased cooling of components 20 in chassis 110.

During manufacture, heat pipe 102 may be formed with a wicking material and fluid in a hollow tube based on a desired heat transfer rate. Heat pipe 102 may have one or more smooth radiused bends to ensure a first end is positioned near a component or cold plate. A second end of heat pipe 102 may be closed using a process that results in heat pipe 102 having an unusable length. The second end of heat pipe 102 may be formed with a first portion 102a coupled to a plurality of fins 116 in a fin stack 104, wherein the first portion 102a comprises a usable length. Heat pipe 102 may be formed with a sharp angled bend 102c to configure second portion 102b for contact with one fin 116, wherein the second portion 102b comprises unusable length. Heat pipe 102 may be bent at a sharp angle such that a second portion 102b of heat pipe 102 is in contact with the one fin 116. Second portion 102b may be welded, soldered, affixed using a thermally-conductive adhesive, or otherwise coupled to fin 116.

In operation, heat may cause fluid in heat pipe 102 to transition to a vapor at a first end and travel to a second end. The vapor may travel through one or more smooth radiused bends to first portion 102a in contact with the edges of a plurality of fins 116 in fin stack 104, wherein heat is transferred from heat pipe 102 to the plurality of fins 116 by conduction. Heat transfer from first portion 102a to second portion 102b may be minimal due to sharp angled bend 102c closing off heat pipe 102 thereby preventing or minimizing the amount of fluid that can be transported between first portion 102a and 102b. However, any heat that reaches the end of first portion 102a may transfer heat to second portion 102b via conduction to the one fin 116. Fan 106 generates an airflow that passes through fin stack 104, wherein the airflow transfers heat from fins 116 in fin stack 104 through vent 114 to the ambient environment. Cooling of the fluid causes the fluid in first portion 102a to transition from a vapor to a liquid, wherein the wicking material transports the liquid back to the first end of heat pipe 102.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A thermal module for use in a chassis for an information handling system, the thermal module comprising:
   a fan for generating an airflow in the direction of a vent;
   a fin stack comprising a plurality of fins distributed over a width of the fin stack, the fin stack positioned relative to the vent; and
   a heat pipe comprising:
      a sealed hollow tube formed from a heat conducting material with a two-phase fluid and a wicking material inside the hollow tube, wherein
      a first end of the heat pipe is configured for receiving heat from a set of components, wherein heat is transferred from the set of components through the heat conducting material to change the two-phase fluid to a vapor phase; and
      a second end of the heat pipe is configured with:
         a first portion for contact with an edge of each fin of the plurality of fins in the fin stack, wherein the two-phase fluid condenses to a liquid phase in the first portion at the fin stack and is transported through the hollow tube back to the first end via the wicking material,
         a second portion for contact with a side of one fin of the plurality of fins, and
         a sharp angled bend formed in the heat pipe between the first portion and the second portion to fluidly isolate the first portion from the second portion, wherein heat transfer in the second portion comprises conduction through the heat conducting material.

2. The thermal module of claim 1, wherein the sharp angled bend closes the heat pipe between the first portion and the second portion.

3. The thermal module of claim 1, wherein the second portion of the heat pipe is affixed to a side of the one fin.

4. The thermal module of claim 3, wherein the second portion of the heat pipe is soldered to the side of the one fin.

5. The thermal module of claim 3, wherein the second portion of the heat pipe is affixed to the side of the one fin with a thermally conductive adhesive.

6. The thermal module of claim 1, wherein the second portion of the heat pipe is flattened.

7. The thermal module of claim 1, wherein the sharp angled bend comprises a crimp.

8. A method of manufacturing a thermal module for use in a chassis for an information handling system, the method comprising:
  positioning a fan in the chassis;
  forming a first end of a heat pipe for positioning relative to a set of components, the heat pipe comprising a sealed hollow tube formed from a heat conducting material with a two-phase fluid and a wicking material inside the hollow tube, wherein heat is transferred from the set of components through the heat conducting material to change the two-phase fluid to a vapor phase;
  forming a second end of the heat pipe comprising:
    a first portion for contact with an edge of each fin of a plurality of fins in a fin stack, wherein the two-phase fluid condenses to a liquid phase in the first portion at the fin stack and is transported through the hollow tube back to the first end via the wicking material,
    a second portion for contact with a side of one fin of the plurality of fins, and
    a sharp angled bend formed in the heat pipe between the first portion and the second portion to fluidly isolate the first portion from the second portion, wherein heat transfer in the second portion comprises conduction through the heat conducting material;
  coupling the second portion of the second end of the heat pipe to the side of one fin of the plurality of fins; and
  positioning the fin stack between the fan and a vent in the chassis.

9. The method of claim 8, wherein forming the sharp angled bend comprises bending the second end of the heat pipe to close the heat pipe between the first portion and the second portion.

10. The method of claim 8, wherein coupling the second portion to a side of the one fin comprises soldering the second portion to the side of the one fin.

11. The method of claim 8, wherein coupling the second portion to the side of the one fin comprises affixing the second portion to the side of the one fin with a thermally-conductive adhesive.

12. The method of claim 8, further comprising flattening the second portion of the heat pipe before forming the sharp angled bend.

13. The method of claim 8, wherein forming the sharp angled bend comprises crimping the second portion of the heat pipe and bending the second portion to the sharp angle.

14. A chassis comprising:
  a set of components;
  a fan for generating an airflow in the direction of a vent;
  a fin stack positioned between the fan and the vent, the fin stack having a plurality of fins distributed over a width of the fin stack; and
  a heat pipe comprising a sealed hollow tube formed from a heat conducting material with a two-phase fluid and a wicking material inside the hollow tube, wherein:
    a first end of the heat pipe is configured for receiving heat from the set of components, wherein heat is transferred from the set of components through the heat conducting material to change the two-phase fluid to a vapor phase; and
    a second end of the heat pipe is configured with:
      a first portion for contact with an edge of each fin of the plurality of fins in the fin stack, wherein the two-phase fluid condenses to a liquid phase in the first portion at the fin stack and is transported through the hollow tube back to the first end via the wicking material,
      a second portion for contact with a side of one fin of the plurality of fins, and
    a sharp angled bend formed in the heat pipe between the first portion and the second portion to fluidly isolate the first portion from the second portion, wherein heat transfer in the second portion comprises conduction through the heat conducting material.

15. The chassis of claim 14, wherein the sharp angled bend closes the heat pipe between the first portion and the second portion.

16. The chassis of claim 14, wherein the second portion of the heat pipe is affixed to the side of the one fin.

17. The chassis of claim 16, wherein the second portion of the heat pipe is soldered to the side of the one fin.

18. The chassis of claim 14, wherein the second portion of the heat pipe is affixed to the side of the one fin with a thermally conductive adhesive.

19. The chassis of claim 14, wherein the second portion of the heat pipe is flattened and bent to form the sharp angled bend.

20. The chassis of claim 14, wherein the sharp angled bend second portion is crimped and bent to form the sharp angled bend.

* * * * *